United States Patent
Van Der Laan

(10) Patent No.: US 11,587,701 B2
(45) Date of Patent: Feb. 21, 2023

(54) SERIES-CONNECTED SUPERCONDUCTING MAGNET CABLES

(71) Applicant: Advanced Conductor Technologies LLC, Boulder, CO (US)

(72) Inventor: Daniël Cornelis Van Der Laan, Longmont, CO (US)

(73) Assignee: ADVANCED CONDUCTOR TECHNOLOGIES LLC, Boulder, CO (US)

( * ) Notice: Subject to any disclaimer, the term of this patent is extended or adjusted under 35 U.S.C. 154(b) by 583 days.

(21) Appl. No.: 16/702,521

(22) Filed: Dec. 3, 2019

(65) Prior Publication Data

US 2020/0185129 A1 Jun. 11, 2020

Related U.S. Application Data

(60) Provisional application No. 62/775,786, filed on Dec. 5, 2018.

(51) Int. Cl.
*H01B 12/02* (2006.01)
*G01R 33/3815* (2006.01)
(Continued)

(52) U.S. Cl.
CPC ......... *H01B 12/02* (2013.01); *G01R 33/3815* (2013.01); *H01B 3/12* (2013.01);
(Continued)

(58) Field of Classification Search
CPC . H01B 12/02; H01B 3/12; H01B 3/18; H01B 12/06; H01B 9/04; G01R 33/3815;
(Continued)

(56) References Cited

U.S. PATENT DOCUMENTS 3,292,016 A * 12/1966 Kafka .................... H01B 12/00
174/15.5
5,689,223 A * 11/1997 Demarmels ............... H01F 6/06
505/231
(Continued)

FOREIGN PATENT DOCUMENTS

CN 101840775 A 9/2010
WO WO-2012/074065 A1 6/2012

OTHER PUBLICATIONS

International Search Report and Written Opinion dated Feb. 6, 2020, from application No. PCT/US2019/064545.
(Continued)

*Primary Examiner* — Steven T Sawyer
(74) *Attorney, Agent, or Firm* — Foley & Lardner LLP

(57) ABSTRACT

A superconducting device includes a superconducting cable having a plurality of superconducting tapes in a plurality of phases, including a first phase, and at least one further phase. One or more superconducting tapes of the first phase is in electrical contact with one or more superconducting tapes of the at least one further phase through at least one resistive barrier that prevents current from passing between the first phase and the at least one further phase in the absence of a voltage between one or more of the superconducting tapes of the first phase or the at least one further phase. The first phase is electrically connected in series to at least one further phase.

18 Claims, 8 Drawing Sheets

(51) Int. Cl.
*H01B 12/06* (2006.01)
*H01B 3/12* (2006.01)
*H01B 3/18* (2006.01)
*H01B 9/04* (2006.01)

(52) U.S. Cl.
CPC ............... *H01B 3/18* (2013.01); *H01B 12/06* (2013.01); *H01B 9/04* (2013.01)

(58) Field of Classification Search
CPC .......... Y02E 40/60; H02G 15/34; B63G 9/06; H01F 13/006; Y10T 29/49014
See application file for complete search history.

(56) References Cited

U.S. PATENT DOCUMENTS

| | | | |
|---|---|---|---|
| 8,624,109 B2 | 1/2014 | Traeholt et al. | |
| 8,938,278 B2* | 1/2015 | van der Laan | H01L 39/2419 505/231 |
| 9,093,200 B2 | 7/2015 | Van Der Laan | |
| 9,324,486 B2 | 4/2016 | Hahn et al. | |
| 9,847,588 B2 | 12/2017 | Fersan | |
| 10,062,485 B2 | 8/2018 | Iwasa et al. | |
| 10,079,092 B2 | 9/2018 | Iwasa et al. | |
| 2012/0286523 A1* | 11/2012 | Hull | H02P 9/48 322/17 |
| 2012/0295792 A1* | 11/2012 | Stemmle | H02G 15/34 62/51.1 |
| 2015/0018221 A1* | 1/2015 | van der Laan | B63G 9/06 29/599 |
| 2015/0080221 A1* | 3/2015 | Delplace | H01R 4/68 174/125.1 |
| 2019/0088391 A1 | 3/2019 | Hahn et al. | |

OTHER PUBLICATIONS

International Preliminary Report on Patentability dated Jun. 17, 2021, from application No. PCT/US2019/064545.

Foreign Search Report on EP 19893123.0 dated Jul. 14, 2022, 9 pages.

* cited by examiner

SERIES-CONNECTED SUPERCONDUCTING MAGNET CABLES

CROSS-REFERENCE TO RELATED APPLICATION

The present application claims priority to U.S. Provisional Patent Application No. 62/775,786, filed on Dec. 5, 2018, which is incorporated by reference herein in its entirety.

GOVERNMENT RIGHTS

This invention was made with government support under contract number DE-SC0018127 sponsored by the United States Department of Energy. The government has certain rights in the invention.

TECHNICAL FIELD

The present disclosure relates generally to superconducting wires or cables and, in particular embodiments, such superconducting wires or cables that have multiple phases separated from one another by either a resistive barrier, or an insulating barrier.

BACKGROUND

High-field superconducting magnets are frequently used for scientific purposes. High current densities are desirable in the magnet winding to reach high magnetic field in a relatively small coil. Such superconducting magnets can use high-temperature superconductors (HTS) to reach magnetic fields over 20 tesla (T) or operating temperatures above 10 kelvin (K). The HTS conductors are often wound as a single tape or a wire, which results in the operating current of the magnet to be in the order of between 100 and 200 amperes (A) due to the limited current capacity of one single HTS tape or wire. Magnets wound from single tapes may be affected by local tape defects that may cause a local hot spot, requiring additional metal stabilizing material to be incorporated within the windings. The stabilizing material allows current to bypass the defect but will reduce the overall current density of the magnet. Magnets would benefit of multi-tape windings in which multiple HTS tapes that are in direct contact to each other are operated in parallel. In multi-tape conductors, current can bypass local tape defects through current sharing with neighboring tapes, reducing the need for more stabilizing material that would reduce the current density in the magnet. Operating multiple tapes in parallel would significantly increase the current capacity of the magnet winding. Certain magnet applications would also benefit from the operating currents greater than 200 A, but in some applications of use less than 1,000 A, to reduce or avoid a need to increase the size of the magnet power source, and to reduce or minimize the thickness or rating of the current leads that inject current from room temperature into the superconducting magnet located in a cryogenic environment. If such current leads are too thick, they may result in a high thermal conduction along their lengths. In typical contexts, the operating current between 200 and 1,000 A may not be readily achieved with a single HTS tape due to its limited current carrying capability. On the other hand, the required high winding current density may not be achievable in certain, multi-tape or wire HTS cables when their operating current is limited to no more than 1,000 A.

BRIEF SUMMARY

A superconducting device according to an example embodiment includes a superconducting cable having first and second ends and a plurality of superconducting tapes in a plurality of phases extending between the first and second ends of the cable, where the plurality of phases including a first phase, and at least one further phase, each phase having one or more of the superconducting tapes. The one or more superconducting tapes of the first phase is in electrical contact with one or more superconducting tapes of the at least one further phase through at least one resistive barrier that prevents current from passing between the first phase and the at least one further phase in the absence of a voltage between one or more of the superconducting tapes of the first phase or the at least one further phase. The first phase on the first end of the superconducting cable is electrically connected in series to the at least one further phase on the second end of the superconducting cable.

In a further example of the superconducting device, the first end of the superconducting cable has a tapered configuration that exposes the one or more of the superconducting tapes of the first phase. In addition, the second end of the superconducting cable has a tapered configuration that exposes one or more of the superconducting tapes of the at least one further phase. A connector electrically connects the one or more superconducting tapes of the first phase on the first end of the superconducting cable to the one or more superconducting tapes of the at least one further phase on the second end of the superconducting cable in series.

In a further example of the superconducting device, the plurality of superconducting tapes are wound around a former in a plurality of layers, where the first phase includes one or more of the plurality of layers, and the at least one further phase includes a further one or more of the plurality of layers.

In a further example, the superconducting device includes the resistive barrier, and the resistive barrier includes at least one layer of one or more metal tapes located between the first phase and the at least one further phase.

In a further example, the superconducting device includes the resistive barrier, and the resistive barrier includes one or more of a metal, insulating, ceramic or organic coating or interface between the first phase and the at least one further phase.

In a further example of the superconducting device, the first phase includes a plurality of phases that are connected together in parallel, and the at least one further phase includes a plurality of further phases that are connected together in parallel.

In a further example of the superconducting device, the series connection between the first phase and the at least one further phase is converted to a parallel connection during operation of the cable.

In a further example of the superconducting device, at least two of the further phases are electrically insulated from each other.

In a further example of the superconducting device, the first phase comprises a plurality of phases that are connected together in parallel, the at least one further phase comprises a plurality of the further phases that are connected together in parallel.

In a further example of the superconducting device, the at least one further phase includes a second phase and a third phase, the first phase is in electrical contact with the at least one second phase through a first resistive barrier of the at least one resistive barriers, and the at least one second phase is in electrical contact with the at least one third phase through a second resistive barrier of the at least one resistive barriers.

In a further example, a superconducting device includes a superconducting cable having a plurality of layers of superconducting material arranged in a plurality of phases, and at least one insulating barrier electrically separating the phases from each other. A connector structure connects first and second ends of the superconducting cable, where the connector structure electrically connects at least two of the phases in parallel and connects the two parallel-connected phases in series with at least another two of the phases that are also connected in parallel.

In a further example of that superconducting device, each of the first and second ends of the superconducting cable are tapered to expose the plurality of phases at each end, for connection through the connector structure.

In a further example of that superconducting device, the series connection is converted to parallel connections during operation of the cable.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Figure 1:
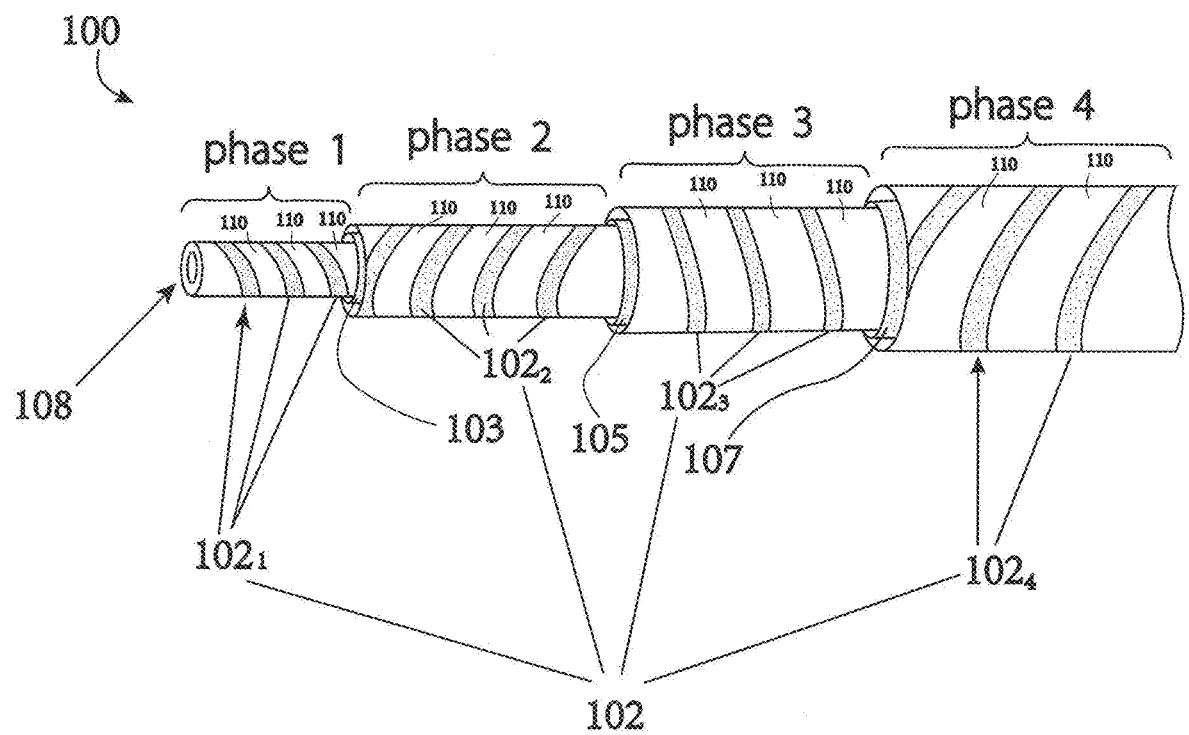
FIG. 1 is a perspective view of an end portion of a superconducting wire, according to an embodiment of the present disclosure.

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated. Further, features or aspects within each example embodiment should typically be considered as available for other similar features or aspects in other example embodiments.

Superconducting devices according to various embodiments of the present disclosure may be configured for general or particular applications of operation and use including, but not limited to transmission lines for electrical power, electrical coils, magnets, inductors, or other devices and systems. Superconducting devices that employ superconducting conductors arranged in coils can be configured for or employed in a variety of applications including, but not limited to strong superconducting electromagnets for superconducting magnetic energy storage (SMES) systems, magnetic resonance imaging (MRI) or other medical devices, nuclear magnetic resonance (NMR) spectrometers, mass spectrometers or other scientific equipment, fusion reactors, particle accelerators, solenoids, magnetic levitation systems, or other devices or systems.

Embodiments of the present disclosure relate to superconducting devices including at least one superconducting cable, wire or the like (hereinafter "superconducting wires") having first and second ends. The superconducting wire includes a plurality of superconducting tapes in a plurality of phases extending between the first and second ends. One or more superconducting tapes of a first phase is in electrical contact with one or more superconducting tapes of a second phase through at least one resistive barrier. The resistive barrier is configured to prevent current from passing between the first phase and the second phase in the absence of a voltage on one or more of the superconducting tapes of the first phase or the second phase. Further, the first phase on the first end of the superconducting wire is electrically connected in series to the second phase on the second end of the superconducting wire.

Example embodiments of the present disclosure include, but are not limited to, a superconducting wire (e.g., an HTS magnet cable) that allows for operating currents in the order of 200 to 1,000 A while having sufficiently high current density to allow the magnet to operate at a winding current density of at least 200 A/mm$^2$ at 4.2 K and 20 T, and potentially at a much higher winding current density. In certain examples, the superconducting wire may include one or more superconducting tapes wound on or disposed within a Conductor on Round Core (CORC®) superconducting cable. Examples of the CORC® superconducting cable are described in U.S. Pat. No. 8,938,278 (incorporated herein by reference, in its entirety). Such superconducting tapes may include, but are not limited to, RE-Ba$_2$Cu$_3$O$_{7-\delta}$ (REBCO) tapes. In other examples, the superconducting wire includes or is formed in another suitable superconducting cable, tape, wire or other configuration. The superconducting tapes of the superconducting wire may be wound in two or more (a plurality of) different phases, or current paths. The different phases are either insulated electrically from one another by an insulating barrier, or separated from another by a resistive barrier, or by a combination of insulating and resistive barriers. A resistive barrier may have a material or configuration providing a relatively high electrical resistivity (e.g., when compared to the superconducting tapes) such as, for example, one or more layers of electrically resistive tapes of stainless steel, copper, resistive material coating, a combination thereof, or the like. In some embodiments, the superconducting wire may be wound into a magnet or a coil form. In some coil examples, different phases of the superconducting wire are connected in series at the two ends of the superconducting wire, to form one or more (or a plurality of) loops of the coil. In such configurations, each turn of the superconducting wire can contain n magnet windings, with n being 2 or more, allowing the current carrying capacity of $1/n^{th}$ of the current capacity of the superconducting wire.

In such configurations, current will predominantly follow the magnet windings as long as the conductor remains superconducting and the change of current over time and thus the inductive voltage remains relatively low (i.e., as a first state of the winding). However, the separation between phases using a barrier with relatively high electrical resistivity allows current to cross the barrier between the electrical paths that form the magnet windings in case of a fault at which a normal zone develops within one of the windings, or during which the magnet is de-energized quickly and a high inductive voltage is generated over each magnet winding (i.e., as a second state of the winding).

The connection between the phases or current paths at the ends of the superconducting wire can be configured such that the desired operating current and magnet inductance can be obtained without changing the magnet configuration of the superconducting wire. In some examples, each phase or current path can be connected in series to reach the lowest operating current. In other examples, the phases can be connected in a combination of parallel and series connections to reach intermediate operating currents. In other examples, each phase or current path can be connected in parallel to allow operation at the highest operating current. Accordingly, by selecting and implementing different connection arrangements, the same base magnet configuration can thus be used for different operating conditions and magnet power supplies. An operating current of the superconducting wire can thus be selected, which allows the superconducting wire to operate as an insert or outsert magnet, and/or to be connected in series with another magnet that operates at a predetermined current such as, but not limited to, a low-temperature superconducting (LTS) magnet.

Typical superconducting wires containing a number of superconducting tapes wound in several layers around a small metal former, such as a CORC® cable or wire, do not contain insulation between the different tapes and, thus, allow current to be shared between the tapes. The tapes of such a superconducting wire are typically wound with a small gap of 0.1-1 millimeters (mm) therebetween to allow the superconducting wire to be bent when wound into a magnet or coil form. Such superconducting wires may include up to 50 or more superconducting tapes that are wound in up to 20 or more layers (or phases) at opposite, or similar pitch from neighboring layers. Current sharing between tapes allows current to bypass local defects in individual tapes, which prevents hot spots from developing.

However, various superconducting wires according to examples disclosed herein, can include several phases or current paths (instead of containing one current path in which all the tapes are connected in parallel at the cable ends). Each phase or current path may be formed by one or more tapes, separated by an electrically insulating barrier (which may include one or more layers of electrically insulating material). Alternatively, or in addition, the phases can be separated by an electrical resistive barrier, formed as one or more layers of material with finite resistivity, such as, but not limited to stainless steel, copper, or a resistive coating or interface. Each phase can be connected to a separate power source (or separate output of a common power source), or each phase may be connected in series. A series connection between the phases or current paths can be formed by winding the superconducting wire in a closed loop (as a magnet or coil) in one or more (or a plurality of) turns. The ends of the superconducting wire can be trimmed, tapered, or otherwise modified to expose the different phases and the ends of the phases can be brought together and connected with a connector. Examples of suitable connections between different phases of a superconducting wire are described in U.S. Pat. No. 9,093,200 (incorporated herein by reference, in its entirety).

Each phase or current path in a superconducting wire according to examples disclosed herein includes one or more tape layers (of one or more layers of superconducting tapes) separated by one or more intermediate layers of insulating or resistive barriers. In certain embodiments, each superconducting tape layer in the same phase or current path is wound directly on top of an underlying layer of superconducting tape. In other embodiments, each superconducting tape layer is separated from one or more other superconducting tape layers in the same phase by one or more layers of stainless steel tapes, copper tapes, other electrically conductive material, or the like. The stainless steel, copper or other electrically conductive material form a barrier for current to cross from one superconducting tape layer to an adjacent superconducting tape layer. In certain examples, the electrical resistance between the superconducting tapes that collectively form a phase can be selected or adjusted to have a certain value by selecting the preferred material, the thickness of the material, the number of layers, or a combination thereof. In certain examples, the resistive barrier between adjacent superconducting tapes can be provided by winding one or more layers of resistive material between the adjacent superconducting tapes. Alternatively, or in addition, the resistive barrier can be formed by plating a layer of resistive material onto the superconducting tapes.

Referring to FIG. 1, a perspective view of an example of a superconducting wire 100 is shown. The superconducting wire 100 includes a plurality of different phases or current paths, phase 1, phase 2, phase 3, and phase 4, separated by respective resistive barriers, 103, 105, and 107. The superconducting wire 100 has a plurality of superconducting tapes 102 ($102_1$, $102_2$, $102_3$ and $102_4$), wound in the four phases (phase 1, phase 2, phase 3 and phase 4), respectively, on a former 108. Other embodiments may be configured with superconducting tapes wound in a single phase, two phases, three phases or more than four phases.

In the multiphase embodiments, each phase is in electrical contact with an adjacent phase by one or more layers of a resistive barrier, e.g., 103-107. In the embodiment of FIG. 1, the resistive barrier 103 is arranged between phase 1 and phase 2, the resistive barrier 105 is arranged between phase 2 and phase 3, and the resistive barrier 107 is arranged between phase 3 and phase 4. In further embodiments, an insulating barrier may be arranged or wound on and over the outermost phase (e.g., phase 4 in FIG. 1). Each of the resistive barriers 103-107 between each pair of adjacent phases may be any suitable material that provides suitable electrically conductive connection characteristics, electrical resistivity and mechanical flexibility to function as described herein. In some embodiments, the resistive barriers 103-107 can each include at least one layer of one or more electrically conductive tapes (for normal electrical conduction) such as, but not limited to metal tapes of stainless steel, copper or other metal, conductive ceramic, or other suitable normally conductive material. In other examples, the resistive barriers 103-107 may be formed of other suitable materials or configurations, including normal electrically conductive coatings, wires, tubes, sheaths or the like.

In examples described herein, each phase of the superconducting wire contains at least one layer of one or more superconducting tapes 102. In further embodiments, one or more (or each) of the phases has two or more (a plurality) of layers of superconducting tapes 102. Each layer has one superconducting tape 102, or a plurality of superconducting tapes 102 wound in parallel (side by side, at approximately the same radial distance from the former 108 as each other wind or tape in the same layer).

In particular embodiments, one or more (or all) of the superconducting tapes 102 in any one or more (or all) of the layers, in any one or more (or all) of the phases are wound with a gap 110 between adjacent tapes in the same layer. For example, gaps 110 may be provided to improve flexibility of the cable, to minimize the number of tapes or amount of each tape needed to fill each layer, or both. Furthermore, gaps 110 can help simplify formation or connection of terminals.

Figure 4:
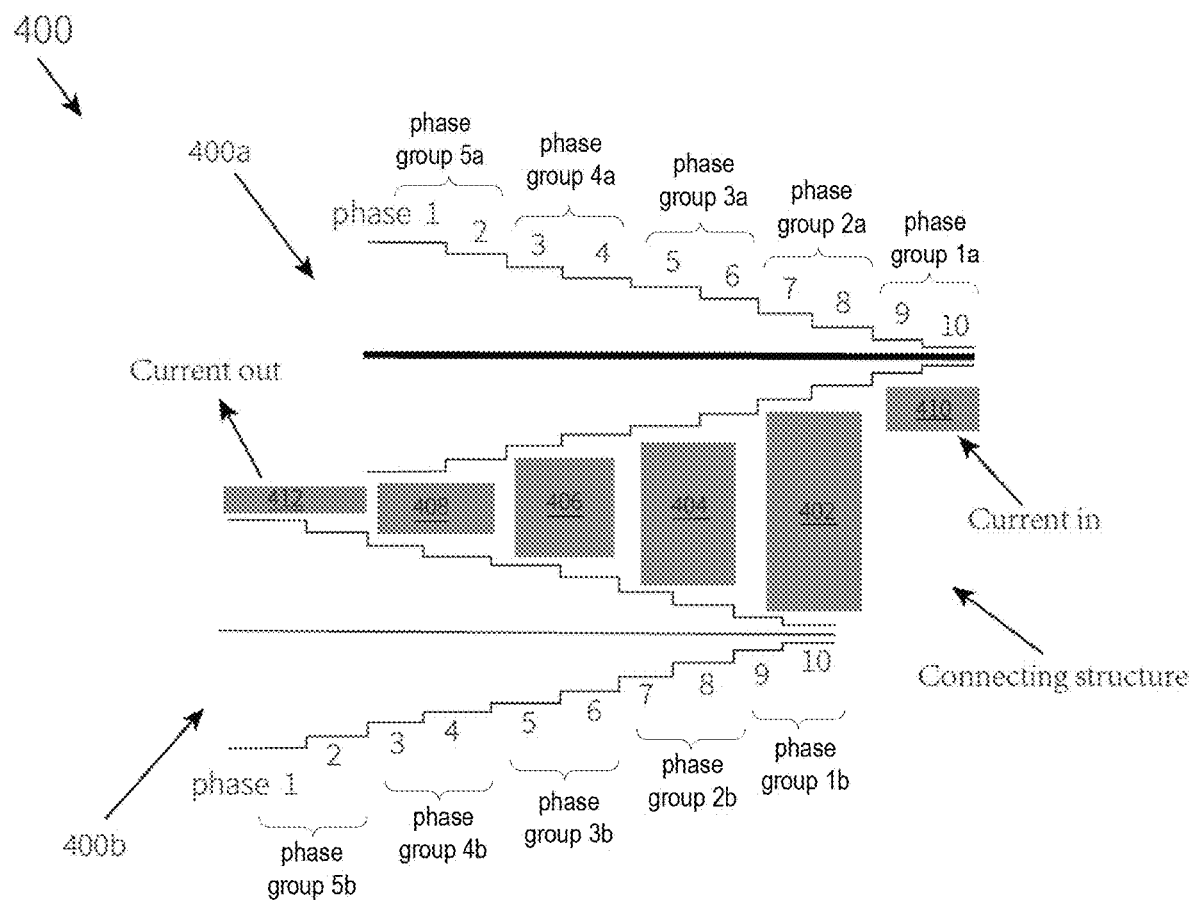
FIG. 4 is a side, schematic view of two ends of a superconducting wire that are connected according to an example of the present disclosure.
Figure 5:
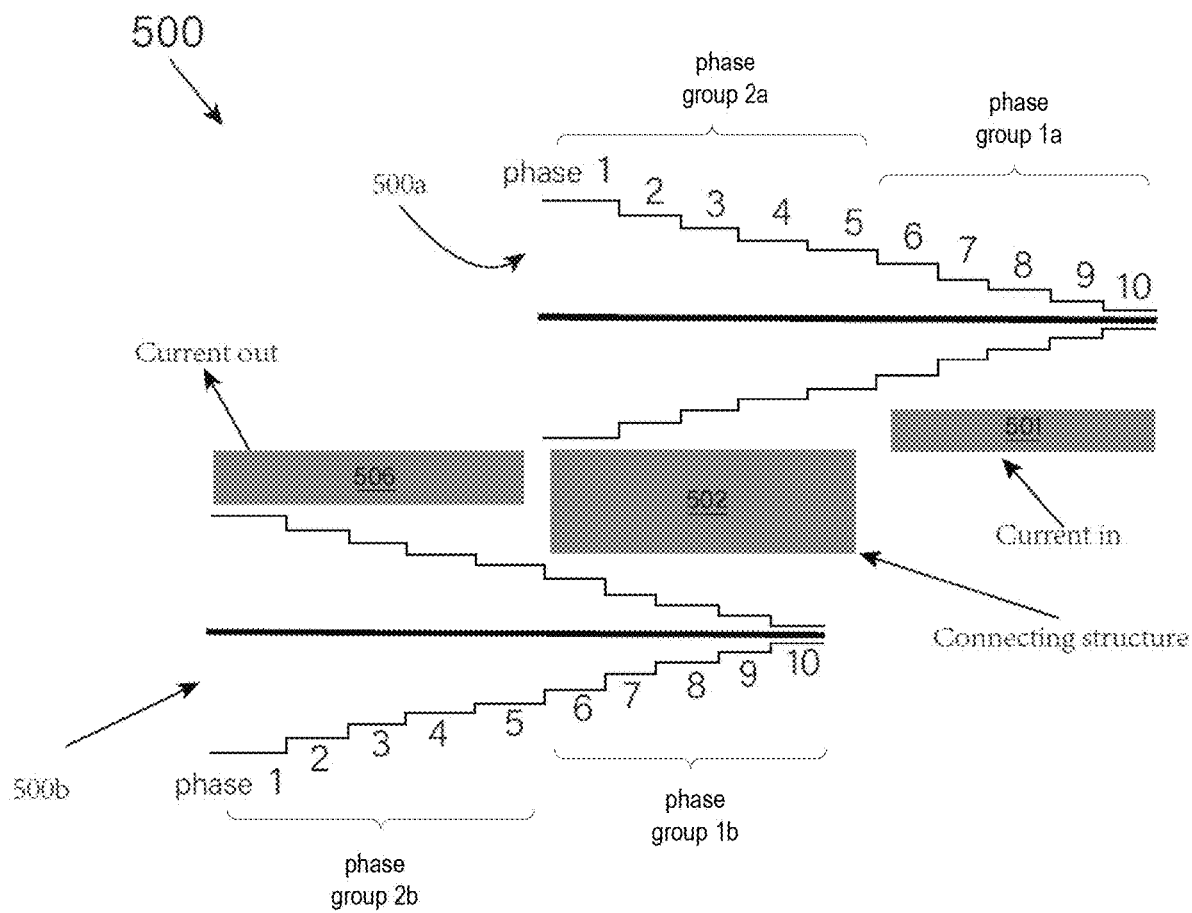
FIG. 5 is a side, schematic view of two ends of a superconducting wire that are connected according to another example of the present disclosure.

The superconducting wire 100 shown in FIG. 1 can be wound into a magnet and the ends of the superconducting wire 100 can be connected together as shown, for example, in FIGS. 4 and 5. Although the resistive barriers between the phases in the superconducting wire 100 are not electrically insulating and, therefore, may allow current to cross different phases, a certain amount of voltage across the resistive barrier is typically required to allow a significant percentage of the current to cross the barrier.

Figure 2:
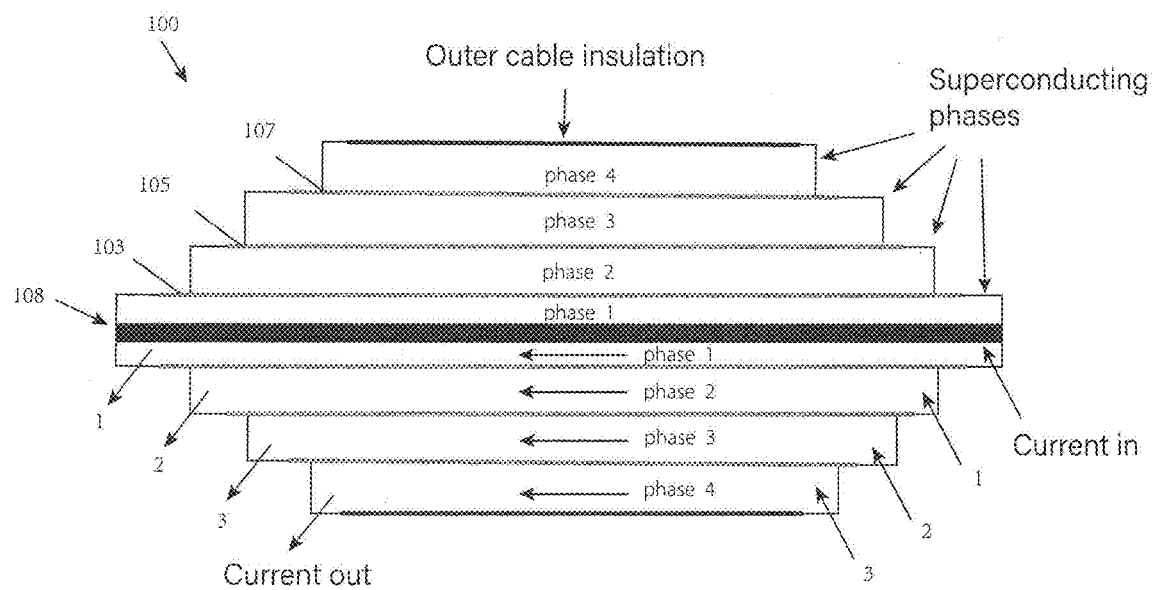
FIG. 2 is a schematic diagram of the longitudinal cross-section of the superconducting wire of FIG. 1 showing current conduction of a first state of the superconducting wire, according to an embodiment of the present disclosure.

For example in FIG. 2, when the current in the superconducting wire 100 is stationary (e.g., during direct-current (DC) operation), each of the phases 1-4 of the superconducting wire 100 may conduct a current in a superconducting state (i.e., no effective resistivity, or substantially small resistivity). As such, no significant voltage is present between the phases that are separated by the respective resistive barriers 103-107, e.g., no significant voltage different is present across the resistive barriers 103-107. Accordingly, in the state shown in FIG. 2, the superconducting wire 100 conducts current along the respective phases 1-4, with the phases 1-4 in a superconducting state. While no significant voltage is present, there will be a small voltage difference between the phases separated by the resistive barrier, where that small voltage is equal to the voltage over the joint that connects the two phases in series. Because the joint has a (low) resistance, voltage is needed for current to flow from one phase to the other over the joint at the cable end. Accordingly, in particular examples, the resistive barrier between phases is configured or selected to provide a sufficient electrical resistance such that the joint voltage does not cause significant current leakage (where current bypasses the joint and instead crosses the resistive barrier between phases).

Figure 3:
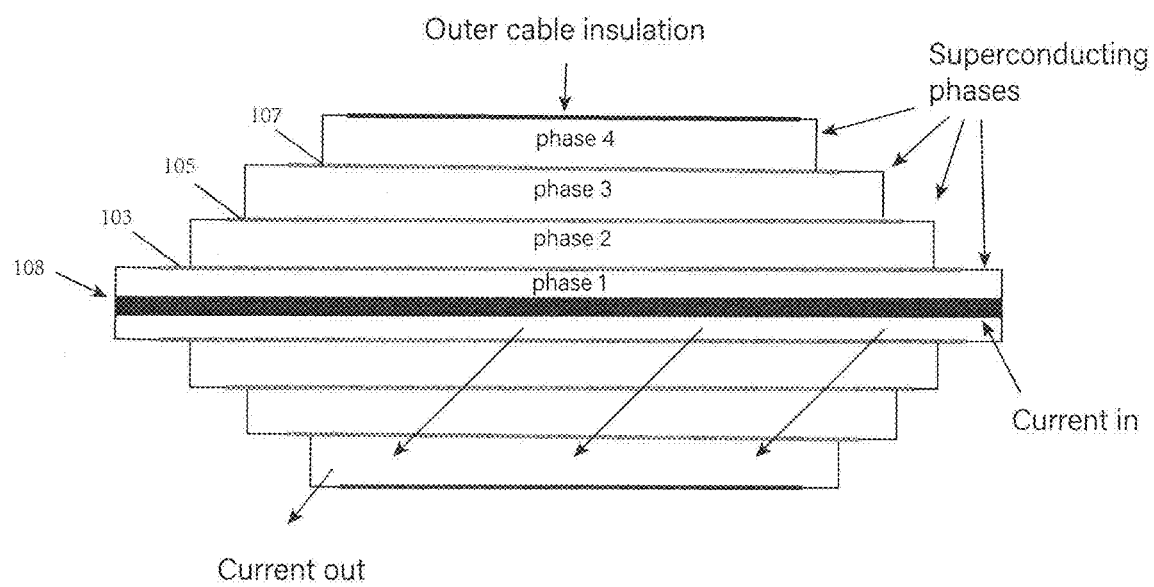
FIG. 3 is a schematic diagram of the longitudinal cross-section of the superconducting wire of FIG. 1 showing current conduction of a second state of the superconducting wire, according to an embodiment of the present disclosure.

In certain cases where the superconducting wire 100 is wound into a magnet and the current in the windings changes over time (for example, but not limited to ramping up and ramping down stages of operation of the magnet). As such, some voltage will develop across the resistive barrier. The voltage across the resistive barrier is a function of current ramping rate and depends on the inductance of the winding. During slow ramping of the current, the percentage of the winding current that crosses the resistive barrier may be relatively small, which may disappear after the ramping of the current stops. However, when the magnet quenches, for instance when a local hot spot or other disturbance drives the superconducting wire 100 into its normal conducting, resistive state (i.e., non-superconducting state), the current may be ramped down fast. Accordingly, a relatively large voltage may develop over the one or more of the resistive barriers, allowing a relatively large percentage of the winding current to cross the one or more resistive barriers between respective phases, in the state shown in FIG. 3. At high ramping rates, the magnet windings are thus shorted along their length, resistive heating occurs where current crosses the resistive barriers, and the stored magnet energy is dissipated relatively evenly along the length of the superconducting wire 100.

A superconducting magnet can be formed by winding a superconducting wire (e.g., 100 in FIG. 1) having a suitable number of superconducting tapes and layers of tapes and, in certain embodiments, may include about 20 to 50 superconducting tapes in about 6 to 20 layers. For example, a superconducting wire may include 30 superconducting tapes wound into 10 layers (3 tapes per layer) onto a former of 2.5-3.0 mm thickness, which results in a conductor thickness of between 3.5 and 4.0 mm. Such a superconducting wire can carry a maximum current, for instance, 3,000 A, at 4.2 K in a magnetic field of 20 T. To energize and operate the superconducting magnet, a power supply capable of delivering up to 3,000 A of current and current leads capable of injecting this level of current from room temperature into the cryogenic environment may be needed.

However, if the same magnet is wound from another superconducting wire containing 30 superconducting tapes wound into 10 layers, with each layer electrically insulated from its neighbors, and each individual phase or current path of the same layer (each containing 3 tapes) connected in series, the magnet can be powered by a current supply and current leads capable of injecting current of no more than about 300 A. The magnet can generate the same magnetic field as the magnet wound from a 30 tape, 10 layer superconducting wire described in the previous paragraph, because the number of turns multiplied by the operating current is the same. Also, the magnet dimensions and thus the winding current density may remain the same between such magnets. This configuration can allow the magnet to operate at a current above what could be achieved with a single superconducting tape (100 A in this example). The winding current density can be significantly higher compared to a magnet wound from a superconducting wire containing only a single phase containing three tapes that operates at 300 A, because the former onto which the tapes are wound occupies a much higher fraction of the wire cross-section that cannot contribute to the superconducting current. For example, the winding current density of a 3.5 mm thick superconducting wire, containing 10 phases each capable of carrying 300 A that are wound onto a 2.5 mm thick former, can be $(10 \times 300 \text{ A})/(3.5 \text{ mm} \times 3.5 \text{ mm}) = 244.9$ $A/mm^2$. The winding current density of a superconducting wire of 2.6 mm thickness containing only one phase wound on the same 2.5 mm thick former would be $300 \text{ A}/(2.6 \text{ mm} \times 2.6 \text{ mm}) = 44.38 \text{ A/mm}^2$, which is insufficient for most magnets to reach high magnetic fields.

A disadvantage of operating the magnet at relatively low current in combination with a higher number of conductor windings, which in the previous example is 10 times the number of cable windings in the magnet, is that the much higher magnet inductance can result in much higher voltages during rapid current ramping or during a quench. A balance between low winding current and reduced magnet inductance can be reached using the same superconducting wire, wound in the same magnet configuration, by configuring the connection between each of the phase groups or current path groups at both ends of the wire such that the preferred number of phases are grouped together in parallel.

FIG. 4 shows an example of a superconducting wire 400 including five different phase groups or current path groups electrically connected in series. In other examples, the superconducting wire 400 may include any other suitable number of phase groups or current paths (more or less than five), and any suitable number of individual phases or current paths in each phase group or current path group. The superconducting wire 400 in the example of FIG. 4 includes ten individual phases, e.g., phase 1, phase 2, phase 3, phase 4, phase 5, phase 6, phase 7, phase 8, phase 9, and phase 10. Each of the phases 1-10 may be formed by one or more superconducting tapes, and separated from one another by an insulating barrier, or a resistive barrier (as described with respect to the example in FIG. 1). Each of the phase groups or current path groups includes two respective individual phases electrically connected in parallel. In the example where each individual phase (in one or more superconducting tapes) can carry up to 300 A current, such a configuration can allow the superconducting wire 400 to operate at a current level of about 600 A (300 A×2). As shown, phase group 2 a includes individual phases 7 and 8 on end 400a; phase group 3a includes individual phases 5 and 6 on end 400a; phase group 4a includes individual phases 3 and 4 on end 400a; phase group 5a includes individual phases 1 and 2 on end 400a; and phase group 1a includes individual phases 9 and 10 on end 400a. Similarly, phase group 1b includes individual phases 9 and 10 on end 400b; phase group 2b includes individual phases 7 and 8 on end 400b; phase group 3b includes individual phases 5 and 6 on end 400b; phase group 4b includes individual phases 3 and 4 on end 400b; and phase group 5b includes individual phases 1 and 2 on end 400b.

In some embodiments, the superconducting wire 400 is installed in a cryostat chamber and formed in one or more loops, with the two ends of the superconducting wire 400 brought together as shown in FIG. 4. In FIG. 4, the ends of the superconducting wire 400 are arranged adjacent each other and pointed in the same direction. In other examples, the ends of the superconducting wire 400 may be arranged to point in opposite directions. In particular examples as shown in FIG. 4, the ends of the superconducting wire 400 are arranged offset relative to each other, with one end (end 400a) extending slightly further in one direction than the other end (end 400b) such that the individual phases on one end of the superconducting wire 400 are offset or staggered relative to the individual phases on the other end of the superconducting wire 400. In other examples, the ends of the superconducting wire 400 may be arranged adjacent, but not offset (such that the individual phases align and are not offset relative to each other).

In the embodiment of FIG. 4, the ends 400a and 400b are arranged such that the respective superconducting tape(s) of phase 7 and phase 8 (phase group 2 a) of the end 400a are arranged adjacent and aligned with the respective superconducting tape(s) of phase 9 and phase 10 (phase group 1b) of the end 400b. Phases 7 and 8 of the end 400a are electrically connected together in parallel, but are also electrically connected with phases 9 and 10 of the end 400b in series. Accordingly, the phases 9 and 10 of the end 400b are, thus, electrically connected to each other in parallel. Similarly, the respective superconducting tape(s) of phase 5 and phase 6 (phase group 3a) of the end 400a are connected together in parallel, and are also arranged adjacent and aligned with (to electrically connect with) the respective superconducting tape(s) of phase 7 and phase 8 (phase group 2b) of the end 400b in series; the respective superconducting tape(s) of phase 3 and phase 4 (phase group 4a) of the end 400a are connected together in parallel, and are also arranged adjacent and aligned with (to electrically connect with) the respective superconducting tape(s) of phase 5 and phase 6 (phase group 3b) of the end 400b in series; the respective superconducting tape(s) of phase 1 and phase 2 (phase group 5a) of the end 400a are electrically connected together in parallel, and are also arranged adjacent and aligned with (to electrically connect with) the respective superconducting tape(s) of phase 3 and phase 4 (phase group 4b) of the end 400b in series.

In some embodiments, the phase groups of the ends 400a-b may be serially connected via a connection structure. For example, phase group 2a of the end 400a is serially connected to phase group 1b of the end 400b via a connection structure 402; phase group 3a of the end 400a is serially connected to phase group 2b of the end 400b via a connection structure 404; phase group 4a of the end 400a is serially connected to phase group 3b of the end 400b via a connection structure 406; and phase group 5a of the end 400a is serially connected to phase group 4b of the end 400b via a connection structure 408.

Such a staggered configuration as shown in FIG. 4 provides an electrical communication (to allow current to enter), for example, from a first current lead 410 into phase group 1a on the end 400a, then through the superconducting wire 400, to phase group 1b on the end 400b. From phase group 1b on the cable end 400b, electrical communication is provided (to allow current to flow) via the connection structure 402 to phase group 2a on the end 400a. From phase group 2a on the cable end 400a, electrical communication is provided (to allow current to flow) via the superconducting wire 400 to phase group 2b on the end 400b. From phase group 2b on the cable end 400b, electrical communication is provided (to allow current to flow) via the connection structure 404 to phase group 3a on the end 400a. From phase group 3a on the cable end 400a, electrical communication is provided (to allow current to flow) via the superconducting wire 400 to phase group 3b on the end 400b. From phase group 3b on the cable end 400b, electrical communication is provided (to allow current to flow) via the connection structure 406 to phase group 4a on the end 400a. From phase group 4a on the cable end 400a, electrical communication is provided (to allow current to flow) via the superconducting wire 400 to phase group 4b on the end 400b. From phase group 4b on the cable end 400b, electrical communication is provided (to allow current to flow) via the connection structure 408 to phase group 5a on the end 400a. From phase group 5a on the cable end 400a, electrical communication is provided (to allow current to flow) via the superconducting wire 400, to phase group 5b on the end 400b and then to a second current lead 412.

FIG. 5 shows an example of another superconducting wire 500 including ten individual phases formed in two different phase groups or current path groups electrically connected in series. The superconducting wire 500 is substantially similar as the superconducting wire 400 and thus, the following discussions shall be focused on the differences between the superconducting wires 400 and 500.

Ends, 500a and 500b, of the superconducting wire 500 are offset or staggered with respect to each other such that the respective superconducting tape(s) of phases 1, 2, 3, 4, and 5 (phase group 2a) of the end 500a are arranged adjacent and aligned with the respective superconducting tape(s) of phases 6, 7, 8, 9, and 10 (phase group 1b) of the end 500b. An input current lead (e.g. a first current lead 501) is connected to all of the phases of phase group 1a (i.e. phases 6, 7, 8, 9 and 10) on the end 500a of the superconducting wire 500. Further, phases 1-5 of on the end 500a are electrically connected together, in parallel, and are also serially connected to phases 6-10 on the end 500b, respectively, via a connection structure 502. In an example where each individual phase (in one or more superconducting tapes) can carry up to 300 A current, such a configuration can allow the superconducting wire 500 to operate at a current level of about 1,500 A (300 A×5). In some embodiments, an electrical connection structure or port (to allow current to enter) can be formed from a first current lead 501 into phase group 1a on the end 500a (which includes parallel-connected phases 6, 7, 8, 9, and 10 on the end 500a), then through the superconducting wire 500, to phase group 1b on the end 500b. From phase 1b on the cable end 500b, electrical communication is provided (to allow current to flow) via the connection structure or port 502 to phase group 2a on the end 500a. From phase 1a on the cable end 500a, electrical communication is provided (to allow current to flow) via the superconducting wire 500, to phase group 2b on the end 500b and then to a second current lead 506.

As described above, by separating the adjacent phases of a superconducting wire by a sufficient resistive barrier, no significant current will cross the resistive barrier. Instead, the current is contained within each of the phases of the superconducting wire, as long as the inductive voltage remains low during current ramping and as long as the contact resistance between the phases at the end of the wire is sufficiently low. However, once a hot spot develops within one of the phases, or once the current is ramped down quickly and/or a relatively large inductive voltage is generated, the current may cross the resistive barrier and jump from one phase to the next, as discussed with respect to FIG. 3. In this regard, the present disclosure describes a superconducting wire that includes a plurality of phases, at least some of which are separated from each other phase by one or more resistive barriers and at least some of which are separated from each other by one or more insulating barriers. By separating some of the phases by the insulating barrier(s), even though the current is ramped down quickly and/or a relatively large inductive voltage is generated, the current can be contained within some of the phases by using the insulating barrier(s) to prevent the current from crossing the phases separated by the insulating barrier(s).

Figure 6:
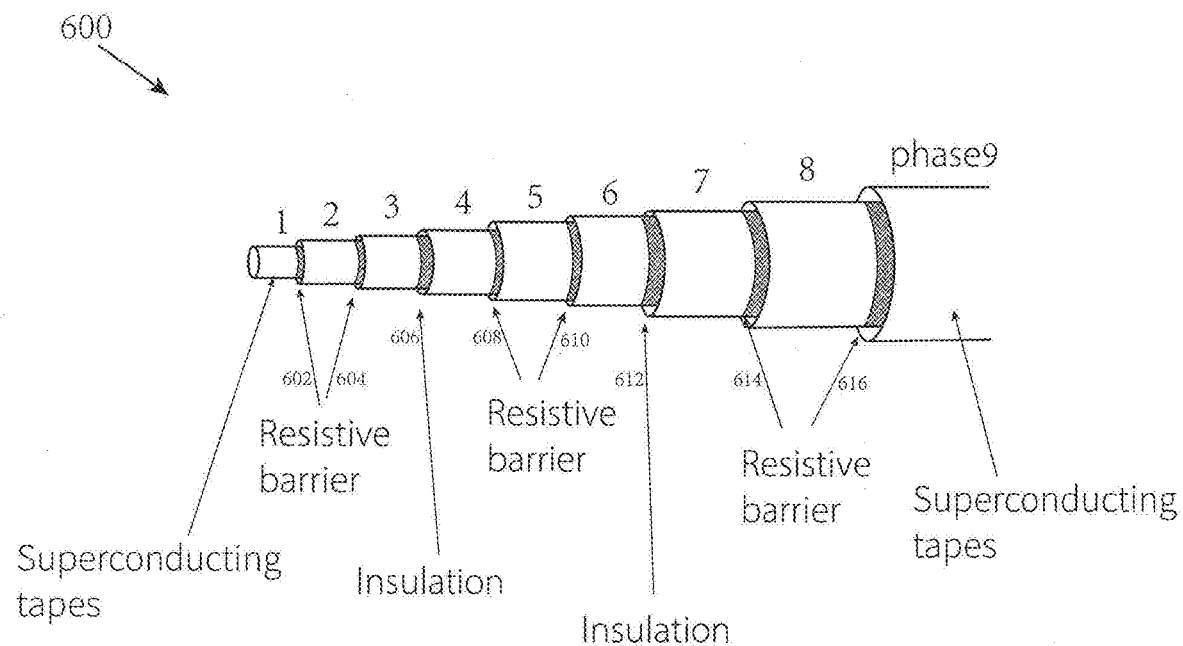
FIG. 6 is a perspective view of an end portion of a superconducting wire, according to an embodiment of the present disclosure.

Referring to FIG. 6, an example of a superconducting wire 600 including a combination of insulating and resistive barriers is shown. As shown, the superconducting wire 600 includes a number of phases: phase 1, phase 2, phase 3, phase 4, phase 5, phase 6, phase 7, phase 8, and phase 9. In other examples, the superconducting wire 600 may include any suitable number of phases (more or less than 9 phases). Each of the phases is wound by one or more superconducting tapes. In some embodiments, each phase is separated from each adjacent phase by either a resistive barrier or an insulating barrier. As shown, phase 1 and phase 2 are separated from each other by a resistive barrier 602; phase 2 and phase 3 are separated from each other by a resistive barrier 604; phase 3 and phase 4 are separated from each other by an insulating barrier 606; phase 4 and phase 5 are separated from each other by a resistive barrier 608; phase 5 and phase 6 are separated from each other by a resistive barrier 610; phase 6 and phase 7 are separated from each other by an insulating barrier 612; phase 7 and phase 8 are separated from each other by a resistive barrier 614; and phase 8 and phase 9 are separated from each other by a resistive barrier 616. In the embodiments where phase 9 is the outmost phase of the superconducting wire 600, phase 9 may be covered by an outer insulation. In other examples, other suitable arrangements of resistive and insulating barriers between different combinations of layers may be employed.

One benefit of having a combination of insulating and resistive barriers within one superconducting wire, as shown in FIG. 6, is that the magnet (formed by the superconducting wire) can be configured to operate at a relatively low current when each phase is connected in series, while providing the protection against burnout during a quench (e.g., the current can cross the resistive barriers). The insulating barriers disposed between some of the phases prevent current from crossing all the windings and can potentially allow for faster current ramping without the need for longer settling time. In some embodiments, the settling time may refer to time needed to have the current passing the resistive barriers die out. The magnet can also be configured to have the phases within each insulated phase (e.g., the phases sandwiched by the adjacent insulating barriers) be connected in parallel, which can result in a higher operating current. For example, the phases 4, 5, and 6, sandwiched by the insulating barriers 606 and 612, can be electrically connected with each other in parallel. Further, those phases in the superconducting wire can remain insulated, allowing for faster current ramping.

Figure 7:
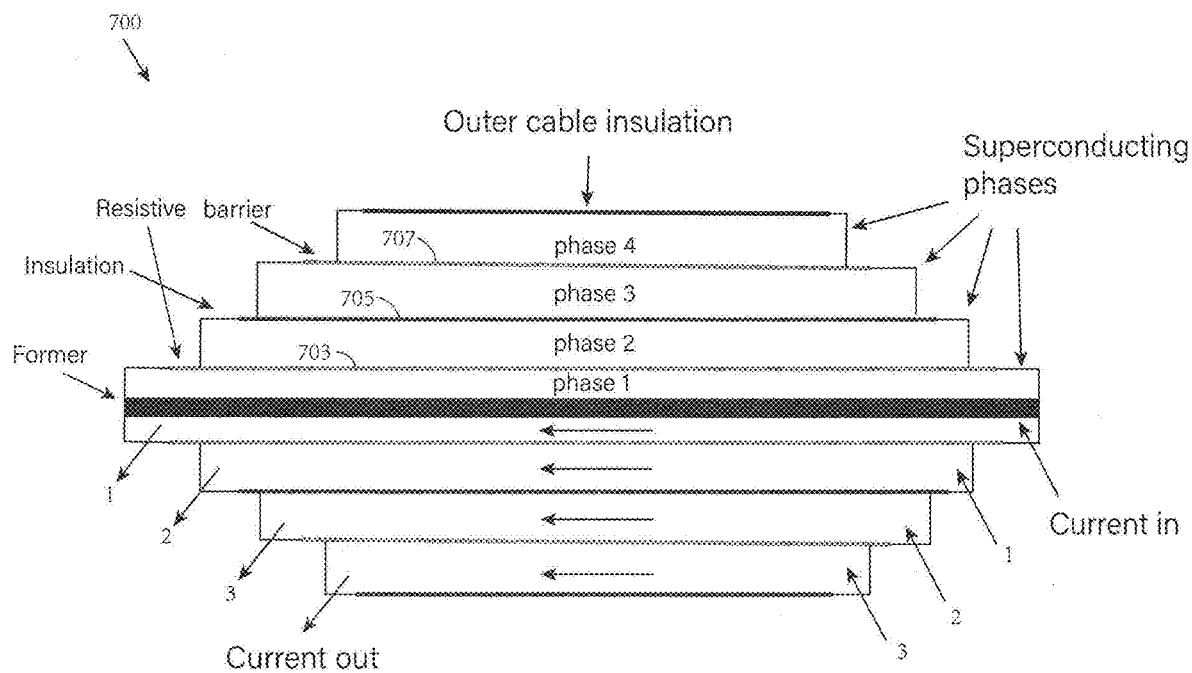
FIG. 7 schematic diagram of the longitudinal cross-section of a superconducting wire of showing current conduction of a first state of the superconducting wire, according to an embodiment of the present disclosure.

For example in FIG. 7, when the current in a superconducting wire 100 is stationary (e.g., during direct-current (DC) operation), each of the phases 1-4 of the superconducting wire 700 may conduct a current in a superconducting state (i.e., no or substantially small resistivity). As such, no significant voltage shall be present between the phases that are separated by the respective resistive barriers 703 and 707 or insulating barrier 705, except the voltage required for current to pass from one phase to the next in the connector structure at the ends of the wire.

Figure 8:
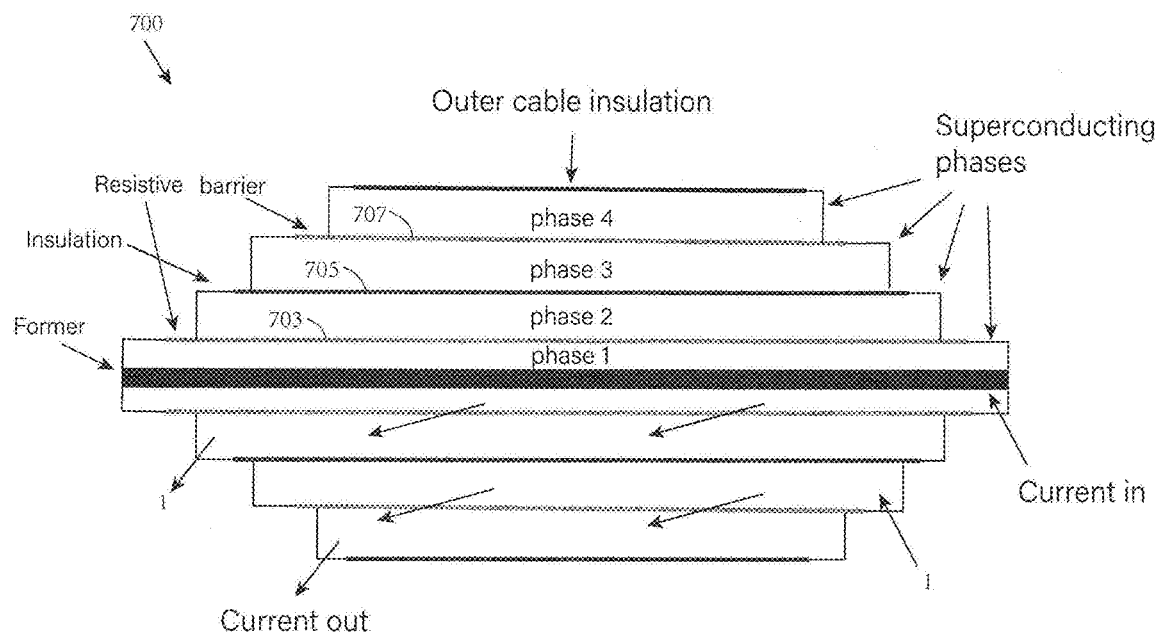
FIG. 8 schematic diagram of the longitudinal cross-section of the superconducting wire of FIG. 7 showing current conduction of a second state of the superconducting wire, according to an embodiment of the present disclosure.

In certain cases where the superconducting wire 700 is wound into a magnet and the current in the windings is changing, significant voltage could develop across the resistive barrier. The voltage across the resistive barrier is a function of current ramping rate and depends on the inductance of the winding. During slow ramping of the current, the percentage of the winding current that crosses the resistive barrier may be relatively small, which may disappear after the ramping of the current stops. However, when the magnet quenches, for instance when a local hot spot or other disturbance drives one of the phases in the superconducting wire 700 into its normal, resistive state (i.e., non-superconducting state), the current may be ramped down fast. Accordingly, a relatively large voltage may develop over the one or more of the resistive barriers, allowing a relatively large percentage of the winding current to cross the one or more resistive barriers between respective phases, as shown in FIG. 8. However, the insulating barrier 705 can prevent current to cross between all the phases. For example, the insulating barrier 705 may confine current within the phases that are blocked (e.g., separated) by the insulating barrier 705. In the illustrated embodiment of FIG. 8, when a voltage is developed during fast current ramping, current can cross the resistive barrier separating phase 1 and phase 2, but shall not cross into phase 3 due to the insulating barrier 705.

In other embodiments, another method to protect the magnet wound from a superconducting wire that includes multiple phases is provided. The phases are separated by either an insulating barrier or a resistive barrier, or a combination thereof, which can prevent the superconducting wire from burnout during a quench by changing the connection between the phases in the superconducting wire from being connected in series to being connected in parallel. This can reduce the magnet induction by a factor $n^2$, with n being the number of phases or current paths in the superconducting wire. The voltage that would develop during fast ramp down can thus be much lower, even when the phases are separated by insulating barriers, allowing the magnet (e.g., wound by the superconducting wire) to be discharged at a much faster rate.

An advantage of operating a magnet wound from a multi-phase, or multi-current path cable or wire at relatively low current is that the magnet can be connected in series with another magnet that operate at relatively low currents in a hybrid configuration, according to certain embodiments of the present disclosure. In some examples, an HTS magnet is inserted within an LTS magnet (or other HTS magnet) to increase the operating field. Research magnets that are often operated at universities or research institutes operate at currents below 500 A due to the cost of power supplies required for operation at higher currents. A magnet system according to certain embodiments described herein can greatly benefit from the ability to connect an HTS insert magnet in series with an LTS outsert magnet, because the magnet system shall require only one power supply. The HTS insert magnet can thus be configured to operate at the same current as the LTS outsert magnet by connecting the different phases or current paths in the superconducting wire that forms the HTS magnet in series.

Another example embodiment using a superconducting wire as described herein, that includes multiple phases or current paths connected in series is a high-field magnet in which the outer coils that have a larger bending diameter are wound from more cost-effective CORC® cables, while the inner coils are wound from more flexible CORC® wires. The current capacity of a less flexible superconducting CORC® cable can be at least 2-3 times higher than the current carrying capacity of a CORC® magnet wire that needs to withstand bending to diameters below 100 mm. In some cases, the operating current of a magnet that combines both CORC® cables and wires may be determined by the lower capacity CORC® wire.

In certain examples, series connection between the two types of coils could be achieved by dividing the superconducting tapes in the higher capacity CORC® cable into two or more parallel current paths that are connected in series. For instance, a CORC® cable that can carry twice the current of a CORC® wire, can contain two independent current paths connected in series, while the CORC® wire contains only one current path. Another example is a CORC® cable that has n times the number of series connected current paths compared to the CORC® wire, with the CORC® wire containing at least 2 separate current paths connected in series.

In further examples, the configurations and processes described herein to wind a magnet or coil from a cable that contains multiple current paths that are separated by an insulating or resistive barrier can be employed with other superconducting wire or cable designs, other than CORC® cables having REBCO tapes that are wound in a helical fashion around a round former. For example, in other embodiments, cables are formed by stacking several HTS tapes on top of each other can also contain barriers that separate the tapes in several current paths. These separate current paths can be connected in series at the cable end using appropriate electrical connectors.

Further examples of configurations and processes described herein are applied to superconducting magnets that are not wound from a cable, but instead are formed of stacks of pancake magnets that are wound from individual tapes. The magnet operating current of these series-connected pancake coils is relatively low, but can be increased when two or more pancake magnets are connected in parallel. This can also lower the magnet inductance, allowing for faster magnet ramping and better protection during a quench.

While superconducting wire and cable examples are described herein as having certain numbers of phases, phase groups, insulating barriers and resistive barriers, the number and arrangement of such features may be varied between different example embodiments, and may be selected and configured to provide a desired current carrying capability, or other operational characteristics.

As utilized herein, the terms "approximately," "about," "substantially," and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "example" and variations thereof, as used herein to describe various embodiments, are intended to indicate that such embodiments are possible examples, representations, and/or illustrations of possible embodiments (and such terms are not intended to connote that such embodiments are necessarily extraordinary or superlative examples).

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

It is important to note that the construction and arrangement of the devices and systems shown in the various exemplary embodiments is illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. Other substitutions, modifications, changes, and omissions may be made in the design, operating conditions and arrangement of the exemplary embodiments without departing from the scope of the present disclosure.

Additionally, any element disclosed in one embodiment may be incorporated or utilized with any other embodiment disclosed herein. Where one example of an element from one embodiment that can be incorporated or utilized in another embodiment described above, it should be appreciated that various features of different embodiments may be incorporated or utilized together with any of the other embodiments disclosed herein.

What is claimed is:

1. A superconducting device, comprising:
a superconducting cable having first and second ends and a plurality of superconducting tapes in a plurality of phases extending between the first and second ends of the cable, the plurality of phases including a first phase, and at least one further phase, each phase having one or more of the superconducting tapes;
the superconducting cable further having at least one resistive barrier, wherein the one or more superconducting tapes of the first phase is in electrical contact with one or more superconducting tapes of the at least one further phase through the at least one resistive barrier;
the resistive barrier comprising an electrically conductive material having a finite resistivity that passes current between the first phase and the at least one further phase in the presence of a sufficient voltage across the resistive barrier, and that prevents current from passing between the first phase and the at least one further phase in the absence of the sufficient voltage across the resistive barrier; and
wherein the first phase on the first end of the superconducting cable is electrically connected in series to the at least one further phase on the second end of the superconducting cable.

2. A superconducting device of claim 1, wherein the first end of the superconducting cable has a tapered configuration that exposes the one or more of the superconducting tapes of the first phase; wherein the second end of the superconducting cable has a tapered configuration that exposes one or more of the superconducting tapes of the at least one further phase, and wherein a connector electrically connects the one or more superconducting tapes of the first phase on the first end of the superconducting cable to the one or more superconducting tapes of the at least one further phase on the second end of the superconducting cable in series.

3. A superconducting device of claim 1, wherein the plurality of superconducting tapes are wound around a former in a plurality of layers, wherein the first phase includes one or more of the plurality of layers, and wherein the at least one further phase includes a further one or more of the plurality of layers.

4. A superconducting device of claim 1, further comprising the resistive barrier, wherein the resistive barrier includes at least one layer of one or more metal tapes located between the first phase and the at least one further phase.

5. A superconducting device of claim 1, further comprising the resistive barrier, wherein the resistive barrier includes one or more of a metal, insulating, ceramic or organic coating or interface between the first phase and the at least one further phase.

6. A superconducting device of claim 1, wherein the first phase comprises a plurality of phases that are connected together in parallel, the at least one further phase comprises a plurality of further phases that are connected together in parallel.

7. A superconducting device of claim 6, wherein the series connection between the first phase and the at least one further phase is converted to a parallel connection during operation of the cable.

8. A superconducting device, comprising:
a superconducting cable having first and second ends and a plurality of superconducting tapes in a plurality of phases extending between the first and second ends of the cable, the plurality of phases including a first phase, and at least one further phase, each phase having one or more of the superconducting tapes;
wherein the one or more superconducting tapes of the first phase is in electrical contact with one or more superconducting tapes of the at least one further phase through at least one resistive barrier that prevents current from passing between the first phase and the at least one further phase in the absence of a voltage between one or more of the superconducting tapes of the first phase or the at least one further phase; and
wherein the first phase on the first end of the superconducting cable is electrically connected in series to the at least one further phase on the second end of the superconducting cable:
wherein the series connection between the first phase and the at least one further phase is converted to a parallel connection during operation of the cable.

9. A superconducting device of claim 1, wherein at least two of the further phases are electrically insulated from each other.

10. A superconducting device of claim 9, wherein the first phase comprises a plurality of phases that are connected together in parallel, the at least one further phase comprises a plurality of the further phases that are connected together in parallel.

11. A superconducting device of claim 10, wherein the series connection between the first phase and the at least one further phase is converted to a parallel connection during operation of the cable.

12. A superconducting device of claim 1, wherein the at least one further phase comprises a second phase and a third phase, and wherein the first phase is in electrical contact with the at least one second phase through a first resistive barrier of the at least one resistive barriers, and wherein the at least one second phase is in electrical contact with the at least one third phase through a second resistive barrier of the at least one resistive barriers.

13. A superconducting device, comprising a superconducting cable having a plurality of layers of superconducting material arranged in a plurality of phases, and at least one insulating barrier electrically separating the phases from each other; and a connector structure connecting first and second ends of the superconducting cable, the connector structure electrically connecting at least two of the phases in parallel and connecting the two parallel-connected phases in series with at least another two of the phases that are also connected in parallel, wherein the series connection is converted to parallel connections during operation of the cable.

14. A superconducting device of claim 8, wherein at least two of the further phases are electrically insulated from each other.

15. A superconducting device of claim 8, wherein the first phase comprises a plurality of phases that are connected together in parallel, the at least one further phase comprises a plurality of further phases that are connected together in parallel.

16. A superconducting device of claim 1, wherein the superconducting cable comprises a flexible cable.

17. A superconducting device comprising:
- a superconducting cable having a plurality of layers of superconducting material arranged in a plurality of phases, one or more of the plurality of phases being separated from at least one adjacent phase of the plurality of phases by a resistive barrier; and
- a connector structure connecting first and second ends of the superconducting cable, the connector structure electrically connecting at least two of the phases in parallel and connecting the two parallel-connected phases in series with at least another two of the phases that are also connected in parallel;
- the resistive barrier comprising an electrically conductive material having a finite resistivity that passes current between phases separated by the resistive barrier in the presence of a sufficient voltage across the resistive barrier and that prevents current from passing between the first phase and the at least one further phase in the absence of the sufficient voltage across the resistive barrier.

18. A superconducting device of claim 17, wherein one or more of the plurality of phases are separated from at least one other adjacent phase of the plurality of phases by an electrically insulating barrier.

* * * * *